(12) United States Patent
Yang et al.

(10) Patent No.: US 10,210,830 B2
(45) Date of Patent: *Feb. 19, 2019

(54) DISPLAY HAVING VERTICAL GATE LINE EXTENSIONS AND MINIMIZED BORDERS

(71) Applicant: Apple Inc., Cupertino, CA (US)

(72) Inventors: Byung Duk Yang, Cupertino, CA (US); Szu-Hsien Lee, Cupertino, CA (US); Kyung-Wook Kim, Cupertino, CA (US); Shih Chang Chang, Cupertino, CA (US); Chun-Yao Huang, Cupertino, CA (US); Hao-Lin Chiu, Campbell, CA (US)

(73) Assignee: Apple Inc., Cupertino, CA (US)

( * ) Notice: Subject to any disclaimer, the term of this patent is extended or adjusted under 35 U.S.C. 154(b) by 6 days.

This patent is subject to a terminal disclaimer.

(21) Appl. No.: 15/631,410

(22) Filed: Jun. 23, 2017

(65) Prior Publication Data

US 2017/0294172 A1     Oct. 12, 2017

Related U.S. Application Data

(63) Continuation of application No. 14/923,246, filed on Oct. 26, 2015, now Pat. No. 9,727,167, which is a
(Continued)

(51) Int. Cl.
*G09G 3/36* (2006.01)
*G02F 1/1368* (2006.01)
(Continued)

(52) U.S. Cl.
CPC ......... *G09G 3/3648* (2013.01); *G02F 1/1345* (2013.01); *G02F 1/1368* (2013.01);
(Continued)

(58) Field of Classification Search
CPC .. G09G 3/3648; G09G 3/3666; G09G 3/3677; G09G 3/3688; G09G 2300/0413;
(Continued)

(56) References Cited

U.S. PATENT DOCUMENTS 4,768,084 A   8/1988   Noda et al.
4,859,623 A   8/1989   Busta
(Continued)

FOREIGN PATENT DOCUMENTS

JP   H11-305681 A    11/1999
JP   2001154197 A    6/2001
(Continued)

*Primary Examiner* — Tom V Sheng
(74) *Attorney, Agent, or Firm* — Treyz Law Group, P.C.; G. Victor Treyz; Joseph F. Guihan

(57) ABSTRACT

A display may have an array of pixels arranged in rows and columns. Each pixel may have a transistor for controlling the amount of output light associated with that pixel. The transistors may be thin-film transistors having active areas, first and second source-drain terminals, and gates. Gate lines may be used to distribute gate control signals to the gates of the transistors in each row. Data lines that run perpendicular to the gate lines may be used to distribute image data along columns of pixels. The gate lines may be connected to gate line extensions that run parallel to the data lines. The data lines may each overlap a respective one of the gate line extensions. Vias may be used to connect the gate line extensions to the gate lines. The gate line extensions may all have the same length.

20 Claims, 16 Drawing Sheets

Related U.S. Application Data continuation-in-part of application No. 14/504,215, filed on Oct. 1, 2014, now Pat. No. 9,293,102.

(51) Int. Cl.

| | |
|---|---|
| *G02F 1/1362* | (2006.01) |
| *H01L 23/528* | (2006.01) |
| *H01L 23/522* | (2006.01) |
| *H01L 27/12* | (2006.01) |
| *G02F 1/1345* | (2006.01) |
| *G06F 3/041* | (2006.01) |
| *G06F 3/044* | (2006.01) |
| *G09F 9/30* | (2006.01) |
| *G02F 1/1333* | (2006.01) |
| *G02F 1/1343* | (2006.01) |

(52) U.S. Cl.
CPC .... *G02F 1/13338* (2013.01); *G02F 1/134309* (2013.01); *G02F 1/136286* (2013.01); *G06F 3/044* (2013.01); *G06F 3/0412* (2013.01); *G06F 3/0416* (2013.01); *G09F 9/30* (2013.01); *G09G 3/3666* (2013.01); *H01L 23/528* (2013.01); *H01L 23/5226* (2013.01); *H01L 27/124* (2013.01); *G02F 2001/13456* (2013.01); *G06F 2203/04103* (2013.01); *G06F 2203/04104* (2013.01); *G06F 2203/04112* (2013.01); *G09G 3/3677* (2013.01); *G09G 3/3688* (2013.01); *G09G 2300/0413* (2013.01); *G09G 2300/0426* (2013.01); *G09G 2310/0281* (2013.01); *H01L 2924/0002* (2013.01)

(58) Field of Classification Search
CPC ... G09G 2300/0426; G09G 2310/0281; G09G 2310/0283; G02F 1/13338; G02F 1/134309; G02F 1/1345; G02F 1/136286; G02F 1/1368; G02F 2001/13456; G06F 3/0412; G06F 3/0416; G06F 3/044; G06F 2203/04103; G06F 2203/04104; G06F 2203/04112; G09F 9/30; H01L 23/5226; H01L 23/528; H01L 27/124; H01L 2924/0002

See application file for complete search history.

(56) References Cited

U.S. PATENT DOCUMENTS

| | | | |
|---|---|---|---|
| 6,569,717 B1 | 5/2003 | Murade | |
| 6,621,488 B1 | 9/2003 | Takeuchi et al. | |
| 7,576,723 B2 | 8/2009 | Lee et al. | |
| 7,738,066 B2 | 6/2010 | Lee | |
| 9,081,447 B2 | 7/2015 | Ishizaki et al. | |
| 9,097,950 B2* | 8/2015 | Zhao | G02F 1/136286 |
| 9,293,102 B1* | 3/2016 | Chiu | G02F 1/1345 |
| 9,727,167 B2* | 8/2017 | Yang | G02F 1/1345 |
| 2002/0075440 A1 | 6/2002 | Deane | |
| 2003/0001222 A1 | 1/2003 | Street et al. | |
| 2003/0030381 A1* | 2/2003 | Yamazaki | G02F 1/13454 |
| | | | 315/169.1 |
| 2003/0128312 A1 | 7/2003 | Lu et al. | |
| 2006/0081887 A1 | 4/2006 | Lyu | |
| 2008/0018583 A1 | 1/2008 | Knapp et al. | |
| 2008/0074567 A1* | 3/2008 | Jeon | G02F 1/1345 |
| | | | 349/33 |
| 2009/0015570 A1 | 1/2009 | Yamazaki | |
| 2011/0102658 A1 | 5/2011 | Wang et al. | |
| 2012/0313881 A1 | 12/2012 | Ge et al. | |
| 2013/0229400 A1 | 9/2013 | Park et al. | |
| 2013/0321251 A1* | 12/2013 | Kang | G09G 3/36 |
| | | | 345/87 |
| 2014/0078104 A1* | 3/2014 | Lee | G06F 3/044 |
| | | | 345/174 |
| 2014/0139490 A1* | 5/2014 | Hwang | G06F 3/042 |
| | | | 345/175 |
| 2014/0167052 A1 | 6/2014 | Park et al. | |
| 2015/0061985 A1* | 3/2015 | Sugiyama | G09G 3/3677 |
| | | | 345/87 |
| 2015/0255015 A1* | 9/2015 | Takahara | G09G 3/3233 |
| | | | 345/76 |
| 2015/0309634 A1* | 10/2015 | Lee | G06F 3/0412 |
| | | | 345/173 |
| 2015/0346860 A1* | 12/2015 | Qin | G06F 3/0412 |
| | | | 345/174 |
| 2016/0019852 A1* | 1/2016 | Kim | G09G 3/3666 |
| | | | 345/103 |
| 2016/0253030 A1 | 9/2016 | Tada et al. | |
| 2016/0274712 A1 | 9/2016 | Liu et al. | |
| 2016/0349890 A1 | 12/2016 | Weng et al. | |

FOREIGN PATENT DOCUMENTS

| | | |
|---|---|---|
| JP | 2003058075 A | 2/2003 |
| JP | 2003066474 A | 3/2003 |
| JP | 2003140181 A | 5/2003 |
| JP | 2003295217 A | 10/2003 |
| JP | 2004516511 A | 6/2004 |
| JP | 2005266394 A | 9/2005 |
| JP | 2010-092275 | 4/2010 |
| JP | 2013210666 | 10/2013 |
| KR | 10-2009-0028741 | 3/2009 |
| TW | 200912842 | 3/2009 |
| WO | 2014077175 A1 | 5/2014 |

\* cited by examiner

DISPLAY HAVING VERTICAL GATE LINE EXTENSIONS AND MINIMIZED BORDERS

This application is a continuation of patent application Ser. No. 14/923,246, filed Oct. 26, 2015, which is a continuation-in-part of patent application Ser. No. 14/504,215, filed Oct. 1, 2014, which are hereby incorporated herein by reference in their entireties.

BACKGROUND

This relates generally to electronic devices, and more particularly, to electronic devices with displays.

Electronic devices often include displays. For example, cellular telephones and portable computers often include displays for presenting information to a user.

Liquid crystal displays contain a layer of liquid crystal material. Pixels in a liquid crystal display contain thin-film transistors and electrodes for applying electric fields to the liquid crystal material. The strength of the electric field in a pixel controls the polarization state of the liquid crystal material and thereby adjusts the brightness of the pixel.

Substrate layers such as color filter layers and thin-film transistor layers are used in liquid crystal displays. In an assembled display, the layer of liquid crystal material is sandwiched between the thin-film transistor layer and the color filter layer. The color filter layer contains an array of color filter elements such as red, blue, and green elements and is used to provide the display with the ability to display color images. The thin-film transistor layer contains thin-film transistor circuitry that forms the thin-film transistors for the array of pixels. The pixels contain capacitors to store data values between successive image frames.

The array of pixels is loaded with data using vertical data lines. Horizontal control lines called gate lines are used in controlling the circuitry of the pixels in the array, so that pixels display the data provided on the data lines. With a typical arrangement, each gate line is associated with a respective row of pixels. A frame of image data may be displayed by asserting each of the gate lines in the display in sequence, so that rows of data can be loaded into the display pixels from the data lines.

The signals on the gate lines are produced by gate driver circuitry. The gate driver circuitry may be implemented using blocks of thin-film transistor circuitry that run along the left and right edges of the thin-film transistor layer and thereby limit the minimum sizes of the left and right edges.

Other types of displays such as organic light-emitting diode displays also have vertical data lines and horizontal control lines. The pixels in an organic light-emitting diode display contain light-emitting diodes that produce light and contain thin-film transistors that control the amount of light that is produced by the light-emitting diodes. The vertical data lines may be used to distribute data to the pixels and the horizontal control line may control the loading of data from the vertical data lines onto the gates of drive transistors that control the outputs of the light-emitting diodes. This type of display may also have blocks of thin-film transistor circuitry along its edges.

For aesthetic reasons and to save space in an electronic device, it may be desirable to reduce the size of the borders of a display. The presence of thin-film driver circuitry along the edges of the display limits the minimum achievable border size for a display. If care is not taken, a display will have larger inactive borders than desired.

It would therefore be desirable to be able to provide improved displays for electronic deices such as displays with minimized borders.

SUMMARY

A display may have an array of pixels arranged in rows and columns. Each pixel may have a transistor for controlling the amount of light associated with that pixel. The transistors may be thin-film transistors having active areas, first and second source-drain terminals, and gates.

Signal lines such as horizontal and vertical lines may be used in controlling the pixels to display images on the display. The signal lines may include horizontally extending gate lines, vertically extending data lines, and vertically extending gate line extensions.

The gate lines may be used to distribute gate control signals to the gates of the transistors in each row. The data lines may run perpendicular to the gate lines and may be used to distribute image data along columns of pixels. The gate line extensions may be connected to the gate lines and may run parallel to the data lines.

The data lines may each overlap a respective one of the gate line extensions. A layer of dielectric may be interposed between the gate line extensions and the overlapping date lines. Vias may be used to connect the gate line extensions to the gate lines. The gate line extensions may all have the same length.

The transistors may be coupled to electrodes that apply electric fields to a liquid crystal layer in a liquid crystal display or the display containing the pixels may be based on other types of display technology (e.g., organic light-emitting diode display technology, electrophoretic display technology, etc.).

Touch sensor circuitry may be incorporated into the display. The display may have an array of capacitive touch sensor electrodes. Touch sensor signal lines may be coupled to the touch sensor electrodes. The touch sensor signal lines may run parallel to the vertically extending gate line extensions.

DETAILED DESCRIPTION

Electronic devices may include displays. The displays may be used to display images to a user. Illustrative electronic devices that may be provided with displays are shown in FIGS. 1, 2, 3, and 4.

Figure 1:
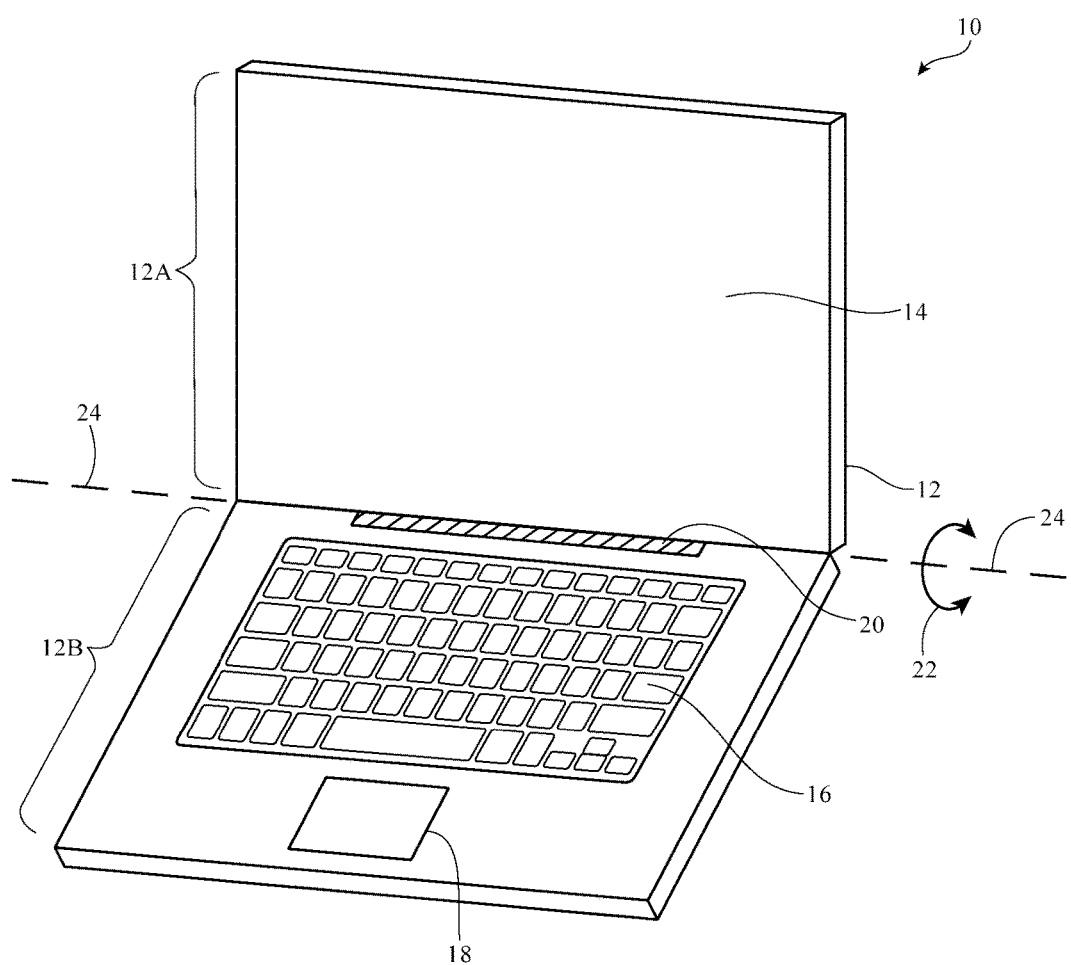
FIG. 1 is a perspective view of an illustrative electronic device such as a laptop computer with a display in accordance with an embodiment.

FIG. 1 shows how electronic device 10 may have the shape of a laptop computer having upper housing 12A and lower housing 12B with components such as keyboard 16 and touchpad 18. Device 10 may have hinge structures 20 that allow upper housing 12A to rotate in directions 22 about rotational axis 24 relative to lower housing 12B. Display 14 may be mounted in upper housing 12A. Upper housing 12A, which may sometimes be referred to as a display housing or lid, may be placed in a closed position by rotating upper housing 12A towards lower housing 12B about rotational axis 24.

Figure 2:
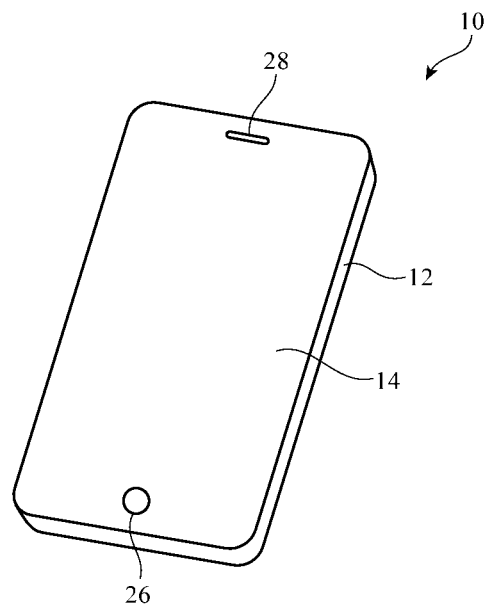
FIG. 2 is a perspective view of an illustrative electronic device such as a handheld electronic device with a display in accordance with an embodiment.

FIG. 2 shows how electronic device 10 may be a handheld device such as a cellular telephone, music player, gaming device, navigation unit, or other compact device. In this type of configuration for device 10, housing 12 may have opposing front and rear surfaces. Display 14 may be mounted on a front face of housing 12. Display 14 may, if desired, have openings for components such as button 26. Openings may also be formed in display 14 to accommodate a speaker port (see, e.g., speaker port 28 of FIG. 2).

Figure 3:
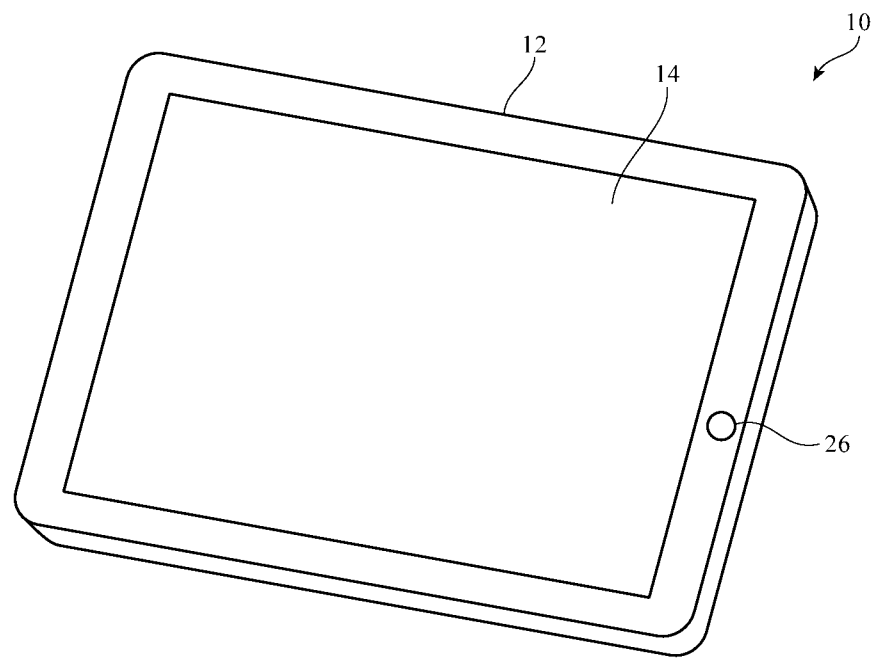
FIG. 3 is a perspective view of an illustrative electronic device such as a tablet computer with a display in accordance with an embodiment.

FIG. 3 shows how electronic device 10 may be a tablet computer. In electronic device 10 of FIG. 3, housing 12 may have opposing planar front and rear surfaces. Display 14 may be mounted on the front surface of housing 12. As shown in FIG. 3, display 14 may have an opening to accommodate button 26 (as an example).

Figure 4:
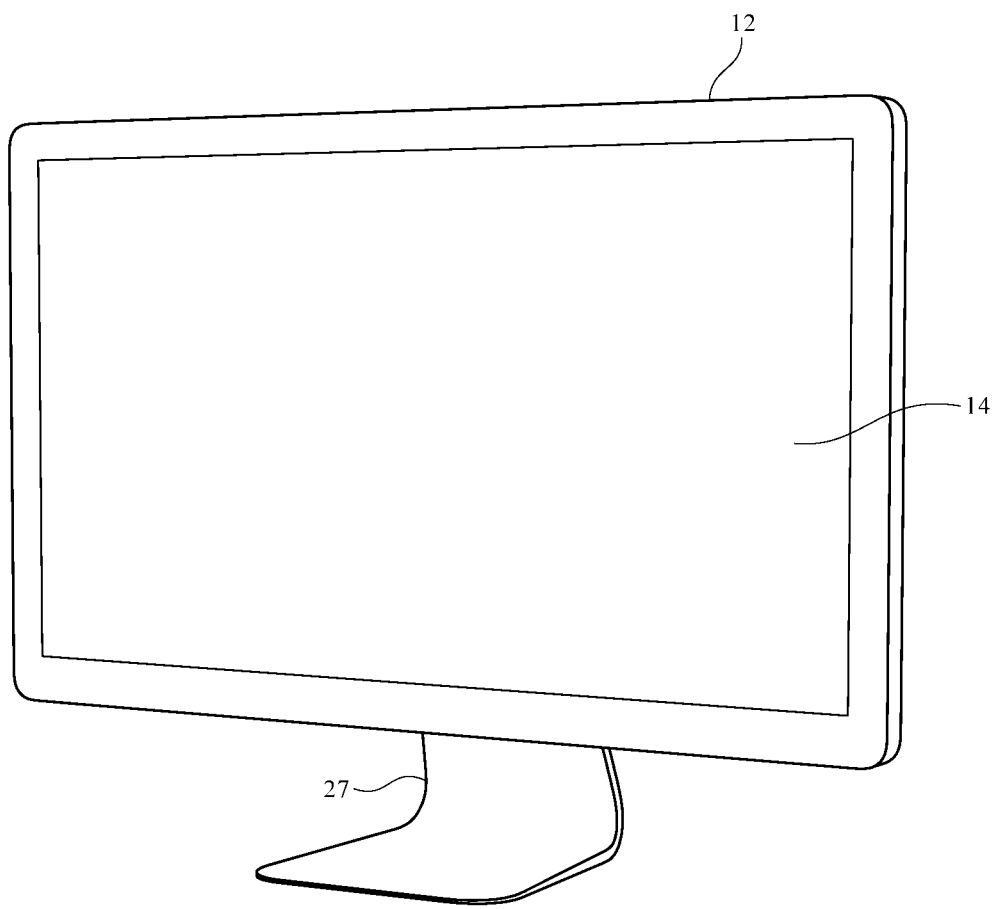
FIG. 4 is a perspective view of an illustrative electronic device such as a computer display with display structures in accordance with an embodiment.

FIG. 4 shows how electronic device 10 may be a computer display or a computer that has been integrated into a computer display. With this type of arrangement, housing 12 for device 10 may be mounted on a support structure such as stand 27 or stand 27 may be omitted (e.g., to mount device 10 on a wall). Display 14 may be mounted on a front face of housing 12.

The illustrative configurations for device 10 that are shown in FIGS. 1, 2, 3, and 4 are merely illustrative. In general, electronic device 10 may be a laptop computer, a computer monitor containing an embedded computer, a tablet computer, a cellular telephone, a media player, or other handheld or portable electronic device, a smaller device such as a wrist-watch device, a pendant device, a headphone or earpiece device, or other wearable or miniature device, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment.

Housing 12 of device 10, which is sometimes referred to as a case, may be formed of materials such as plastic, glass, ceramics, carbon-fiber composites and other fiber-based composites, metal (e.g., machined aluminum, stainless steel, or other metals), other materials, or a combination of these materials. Device 10 may be formed using a unibody construction in which most or all of housing 12 is formed from a single structural element (e.g., a piece of machined metal or a piece of molded plastic) or may be formed from multiple housing structures (e.g., outer housing structures that have been mounted to internal frame elements or other internal housing structures).

Display 14 may be a touch sensitive display that includes a touch sensor or may be insensitive to touch. Touch sensors for display 14 may be formed from an array of capacitive touch sensor electrodes, a resistive touch array, touch sensor structures based on acoustic touch, optical touch, or force-based touch technologies, or other suitable touch sensor components.

Display 14 for device 10 includes display pixels formed from liquid crystal display (LCD) components, organic light-emitting diodes, or other suitable pixel structures. Configurations based on liquid crystal displays are sometimes described herein as an example.

A display cover layer may cover the surface of display 14 or a display layer such as a color filter layer or other portion of a display may be used as the outermost (or nearly outermost) layer in display 14. The outermost display layer may be formed from a transparent glass sheet, a clear plastic layer, or other transparent member.

Figure 5:
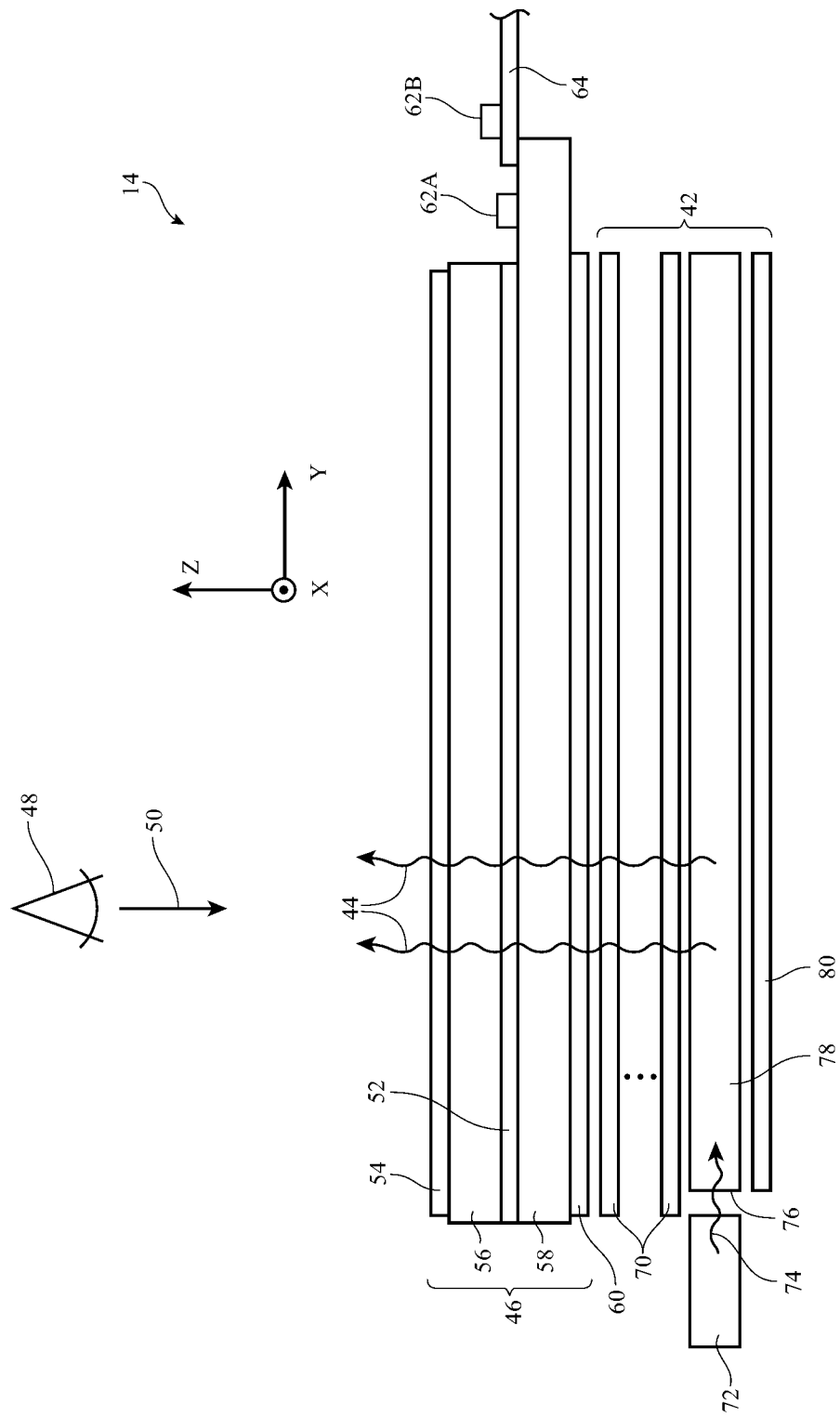
FIG. 5 is a cross-sectional side view of an illustrative display in accordance with an embodiment.

A cross-sectional side view of an illustrative configuration for display 14 of device 10 (e.g., for display 14 of the devices of FIG. 1, FIG. 2, FIG. 3, FIG. 4 or other suitable electronic devices) is shown in FIG. 5. As shown in FIG. 5, display 14 may include backlight structures such as backlight unit 42 for producing backlight 44. During operation, backlight 44 travels outwards (vertically upwards in dimension Z in the orientation of FIG. 5) and passes through display pixel structures in display layers 46. This illuminates any images that are being produced by the display pixels for viewing by a user. For example, backlight 44 may illuminate images on display layers 46 that are being viewed by viewer 48 in direction 50.

Display layers 46 may be mounted in chassis structures such as a plastic chassis structure and/or a metal chassis structure to form a display module for mounting in housing 12 or display layers 46 may be mounted directly in housing 12 (e.g., by stacking display layers 46 into a recessed portion in housing 12). Display layers 46 may form a liquid crystal display or may be used in forming displays of other types.

In a configuration in which display layers 46 are used in forming a liquid crystal display, display layers 46 may include a liquid crystal layer such a liquid crystal layer 52. Liquid crystal layer 52 may be sandwiched between display layers such as display layers 58 and 56. Layers 56 and 58 may be interposed between lower polarizer layer 60 and upper polarizer layer 54.

Layers 58 and 56 may be formed from transparent substrate layers such as clear layers of glass or plastic. Layers 56 and 58 may be layers such as a thin-film transistor layer and/or a color filter layer. Conductive traces, color filter elements, transistors, and other circuits and structures may be formed on the substrates of layers 58 and 56 (e.g., to form a thin-film transistor layer and/or a color filter layer). Touch sensor electrodes may also be incorporated into layers such as layers 58 and 56 and/or touch sensor electrodes may be formed on other substrates.

With one illustrative configuration, layer 58 may be a thin-film transistor layer that includes an array of pixel circuits based on thin-film transistors and associated electrodes (display pixel electrodes) for applying electric fields to liquid crystal layer 52 and thereby displaying images on display 14. Layer 56 may be a color filter layer that includes an array of color filter elements for providing display 14 with the ability to display color images. If desired, layer 58 may be a color filter layer and layer 56 may be a thin-film transistor layer. Configurations in which color filter elements are combined with thin-film transistor structures on a common substrate layer may also be used.

During operation of display 14 in device 10, control circuitry (e.g., one or more integrated circuits on a printed circuit) may be used to generate information to be displayed on display 14 (e.g., display data). The information to be displayed may be conveyed to a display driver integrated circuit such as circuit 62A or 62B using a signal path such as a signal path formed from conductive metal traces in a rigid or flexible printed circuit such as printed circuit 64 (as an example).

Backlight structures 42 may include a light guide plate such as light guide plate 78. Light guide plate 78 may be formed from a transparent material such as clear glass or plastic. During operation of backlight structures 42, a light source such as light source 72 may generate light 74. Light source 72 may be, for example, an array of light-emitting diodes.

Light 74 from light source 72 may be coupled into edge surface 76 of light guide plate 78 and may be distributed in dimensions X and Y throughout light guide plate 78 due to the principal of total internal reflection. Light guide plate 78 may include light-scattering features such as pits or bumps. The light-scattering features may be located on an upper surface and/or on an opposing lower surface of light guide plate 78. Light source 72 may be located at the left of light guide plate 78 as shown in FIG. 5 or may be located along the right edge of plate 78 and/or other edges of plate 78.

Light 74 that scatters upwards in direction Z from light guide plate 78 may serve as backlight 44 for display 14. Light 74 that scatters downwards may be reflected back in the upwards direction by reflector 80. Reflector 80 may be formed from a reflective material such as a layer of white plastic or other shiny materials.

To enhance backlight performance for backlight structures 42, backlight structures 42 may include optical films 70. Optical films 70 may include diffuser layers for helping to homogenize backlight 44 and thereby reduce hotspots, compensation films for enhancing off-axis viewing, and brightness enhancement films (also sometimes referred to as turning films) for collimating backlight 44. Optical films 70 may overlap the other structures in backlight unit 42 such as light guide plate 78 and reflector 80. For example, if light guide plate 78 has a rectangular footprint in the X-Y plane of FIG. 5, optical films 70 and reflector 80 may have a matching rectangular footprint.

Figure 6:
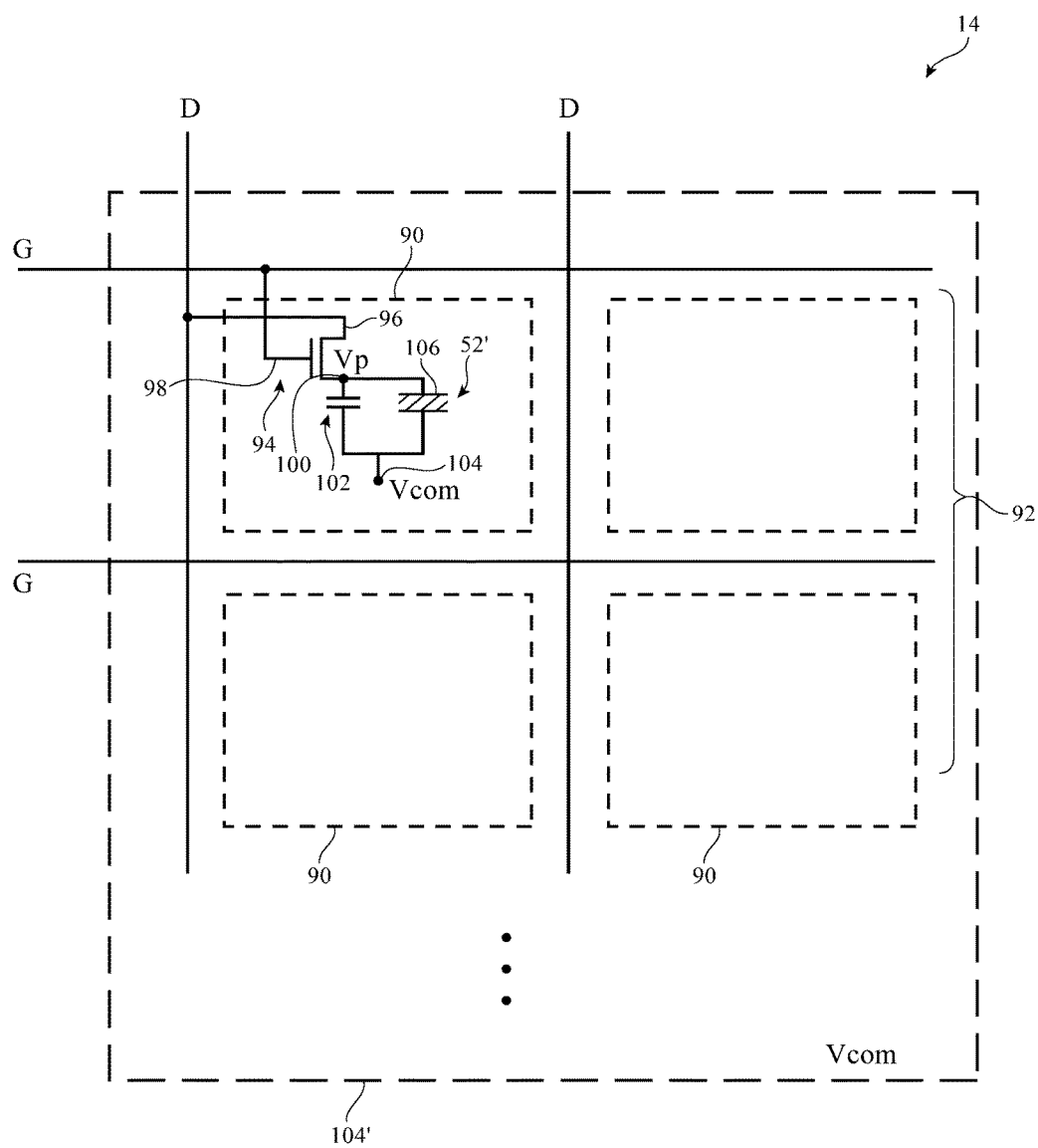
FIG. 6 is a top view of portion of an array of pixels in a display in accordance with an embodiment.

As shown in FIG. 6, display 14 may include an array of pixels 90 such as pixel array 92. Pixel array 92 may be controlled using control signals produced by display driver circuitry. Display driver circuitry may be implemented using one or more integrated circuits (ICs) and/or thin-film transistors or other circuitry.

During operation of device 10, control circuitry in device 10 such as memory circuits, microprocessors, and other storage and processing circuitry may provide data to the display driver circuitry. The display driver circuitry may convert the data into signals for controlling pixels 90 of pixel array 92.

Pixel array 92 may contain rows and columns of pixels 90. The circuitry of pixel array 92 (i.e., the rows and columns of pixel circuits for pixels 90) may be controlled using signals such as data line signals on data lines D and gate line signals on gate lines G. Data lines D and gate lines G are orthogonal. For example, data lines D may extend vertically and gate lines G may extend horizontally (i.e., perpendicular to data lines D).

Pixels 90 in pixel array 92 may contain thin-film transistor circuitry (e.g., polysilicon transistor circuitry, amorphous silicon transistor circuitry, semiconducting oxide transistor circuitry such as InGaZnO transistor circuitry, other silicon or semiconducting-oxide transistor circuitry, etc.) and associated structures for producing electric fields across liquid crystal layer 52 in display 14. Each display pixel may have one or more thin-film transistors. For example, each display pixel may have a respective thin-film transistor such as thin-film transistor 94 to control the application of electric fields to a respective pixel-sized portion 52' of liquid crystal layer 52.

The thin-film transistor structures that are used in forming pixels 90 may be located on a thin-film transistor substrate such as a layer of glass. The thin-film transistor substrate and the structures of display pixels 90 that are formed on the surface of the thin-film transistor substrate collectively form thin-film transistor layer 58 (FIG. 5).

Gate driver circuitry may be used to generate gate signals on gate lines G. The gate driver circuitry may be formed from thin-film transistors on the thin-film transistor layer or may be implemented in separate integrated circuits. To help minimize the inactive borders of display 14 (e.g., the right and left borders), the gate driver circuitry may be located along the upper and/or lower edge of display 14. Vertical gate line extensions that run under the data lines may then serve as gate signal distribution paths that distribute gate signals to the horizontally extending gate lines in display 14.

The data line signals on data lines D in pixel array 92 carry analog image data (e.g., voltages with magnitudes representing pixel brightness levels). During the process of displaying images on display 14, a display driver integrated circuit or other circuitry may receive digital data from control circuitry and may produce corresponding analog data signals. The analog data signals may be demultiplexed and provided to data lines D.

The data line signals on data lines D are distributed to the columns of display pixels 90 in pixel array 92. Gate line signals on gate lines G are provided to the rows of pixels 90 in pixel array 92 by associated gate driver circuitry.

The circuitry of display 14 may be formed from conductive structures (e.g., metal lines and/or structures formed from transparent conductive materials such as indium tin oxide) and may include transistors such as transistor 94 of FIG. 6 that are fabricated on the thin-film transistor substrate layer of display 14. The thin-film transistors may be, for example, silicon thin-film transistors or semiconducting-oxide thin-film transistors.

As shown in FIG. 6, pixels such as pixel 90 may be located at the intersection of each gate line G and data line D in array 92. A data signal on each data line D may be supplied to terminal 96 from one of data lines D. Thin-film transistor 94 (e.g., a thin-film polysilicon transistor or an amorphous silicon transistor) may have a gate terminal such as gate 98 that receives gate line control signals on gate line G. When a gate line control signal is asserted, transistor 94 will be turned on and the data signal at terminal 96 will be passed to node 100 as voltage Vp. Data for display 14 may be displayed in frames. Following assertion of the gate line signal in each row to pass data signals to the pixels of that row, the gate line signal may be deasserted. In a subsequent display frame, the gate line signal for each row may again be asserted to turn on transistor 94 and capture new values of Vp.

Pixel 90 may have a signal storage element such as capacitor 102 or other charge storage elements. Storage capacitor 102 may be used to store signal Vp in pixel 90 between frames (i.e., in the period of time between the assertion of successive gate signals).

Display 14 may have a common electrode coupled to node 104. The common electrode (which is sometimes referred to as the Vcom electrode or Vcom terminal) may be used to distribute a common electrode voltage such as common electrode voltage Vcom to nodes such as node 104 in each pixel 90 of array 92. As shown by illustrative electrode pattern 104' of FIG. 6, Vcom electrode 104 may be implemented using a blanket film of a transparent conductive material such as indium tin oxide and/or a layer of metal that is sufficiently thin to be transparent (e.g., electrode 104 may be formed from a layer of indium tin oxide that covers all of pixels 90 in array 92).

In each pixel 90, capacitor 102 may be coupled between nodes 100 and 104. A parallel capacitance (sometimes referred to as capacitance $C_{LC}$) arises across nodes 100 and 104 due to electrode structures in pixel 90 that are used in controlling the electric field through the liquid crystal material of the pixel (liquid crystal material 52'). As shown in FIG. 6, electrode structures 106 (e.g., a display pixel electrode with multiple fingers or other display pixel electrode for applying electric fields to liquid crystal material 52') may be coupled to node 100 (or a multi-finger display pixel electrode may be formed at node 104). The capacitance $C_{LC}$ across liquid crystal material 52' is associated with the capacitance between electrode structures 106 and common electrode Vcom at node 104. During operation, electrode structures 106 may be used to apply a controlled electric field (i.e., a field having a magnitude proportional to Vp-Vcom) across pixel-sized liquid crystal material 52' in pixel 90. Due to the presence of storage capacitor 102 and the capacitance $C_{LC}$ of material 52', the value of Vp (and therefore the associated electric field across liquid crystal material 52') may be maintained across nodes 106 and 104 for the duration of the frame.

The electric field that is produced across liquid crystal material 52' causes a change in the orientations of the liquid crystals in liquid crystal material 52'. This changes the polarization of light passing through liquid crystal material 52'. The change in polarization may, in conjunction with polarizers 60 and 54 of FIG. 5, be used in controlling the amount of light 44 that is transmitted through each pixel 90 in array 92 of display 14.

Figure 7:
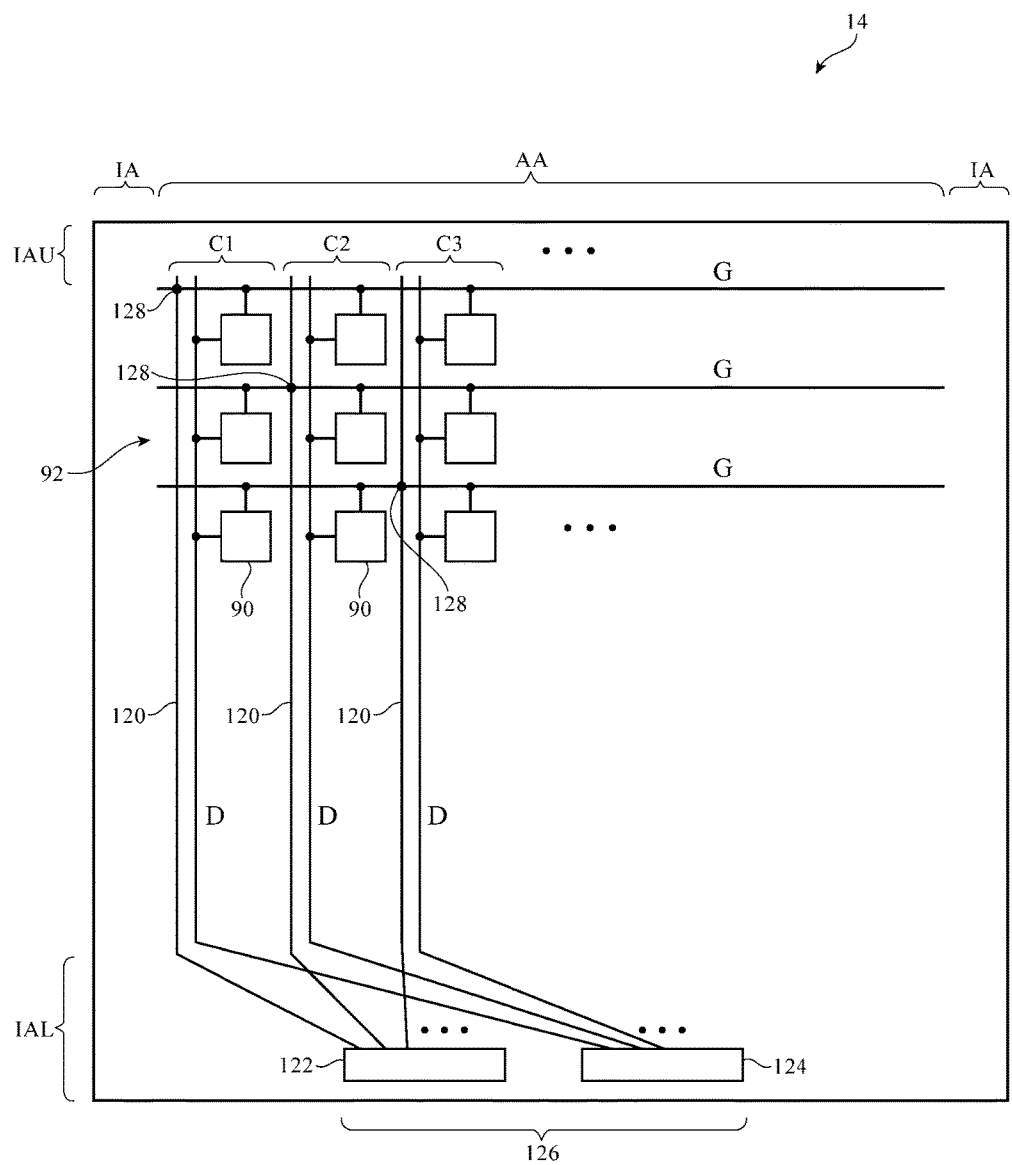
FIG. 7 is a top view of an illustrative display pixel array having vertical gate line extensions and horizontal gate lines in accordance with an embodiment.

As shown in FIG. 7, display 14 may have an active region AA that includes display pixel array 92 of display pixels 90. Display 14 may also have inactive border regions such as left and right inactive areas IA, upper inactive border IAU, and lower inactive border IAL. The size of upper edge inactive area IAU and left and right inactive areas IA can be minimized by locating display driver circuitry 126 along the lower edge of display 14 in lower edge inactive area IAL. In device 10, lower edge inactive area IAL may be hidden from view using a layer of opaque masking material on the underside of a display cover layer or other suitable light-blocking structure.

Display driver circuitry 126 may include display driver circuitry 124 and gate driver circuitry 122. Circuitry 126 may be formed using one or more integrated circuits and/or thin-film transistor circuitry on thin-film transistor layer 58.

Display driver circuitry 124 may include demultiplexing circuitry and column drivers (source driver circuitry) for supplying data signals to respective vertically extending data lines D (or horizontal lines in a version of display 14 that is rotated by 90° with respect to the orientation of FIG. 7). Gate driver circuitry 122 may supply gate control signals (sometimes referred to as gate signals, gate line signals, or pixel control signals) to vertical lines 120. Region IAL may contain lines that fan out to route signals to lines 120 and D from circuitry 126 that is located in the middle of the lower edge of display 14 or other patterns of distribution paths may be used to interconnect circuitry 126 to lines 120 and lines D.

Vertically extending lines such as lines 120 may sometimes be referred to as vertically extending gate line extensions or vertically extending gate signal distribution lines. Lines 120 carry gate line signals from gate driver circuitry 122 to respective connections 128. Connections 128 may be formed from vias (e.g., metal vias) or other electrical connection structures that connect vertical lines 120 to horizontal gate lines G. As shown in FIG. 7, there may be a single connection 128 in each row of pixels 90 in display 14 and each connection 128 may be used in connecting a respective vertical line 120 to a corresponding horizontal gate line G.

Connections 128 may be arranged in a diagonal pattern extending from the upper left corner of display 14 to the lower right corner of display 14, as shown in the example of FIG. 7. Other patterns may be used (e.g., a lower-left-to-upper-right diagonal pattern, patterns in which connections 128 are not arranged in a line, etc.). Preferably, each vertical line 120 is connected to a single corresponding gate lines G, so that each column of pixels 90 (see, e.g., columns C1, C2, C3 . . . ) contains a single connection between a single vertical line 120 and a single one of the gate lines G that intersects that column.

With an arrangement of the type shown in FIG. 7, gate driver circuitry 122 and other display driver circuitry may be located away from the left, right, and upper edges of display 14, allowing the inactive borders associated edges (or at least the right and left edges) to be minimized. The "dummy" portion of each vertically extending line 120 that lies above its connection point 128 is not needed to route gate signals, because the gate signals have already been routed from the portion of vertical line 120 below its connection point 128 to the horizontal gate line G at connection point 128. Nevertheless, it may be advantageous to include this dummy portion at the top of each line 120 to ensure that the amount of parasitic capacitance C that is associated with each line 120 is identical. By constructing all vertical lines 120 with the same length and thereby ensuring that the capacitance of each line 120 is the same, the switching times for each line 120 (and its attached gate line G) will be the same. This allows the gate driver circuits in circuitry 122 to all be constructed using an identical design.

Figure 8:
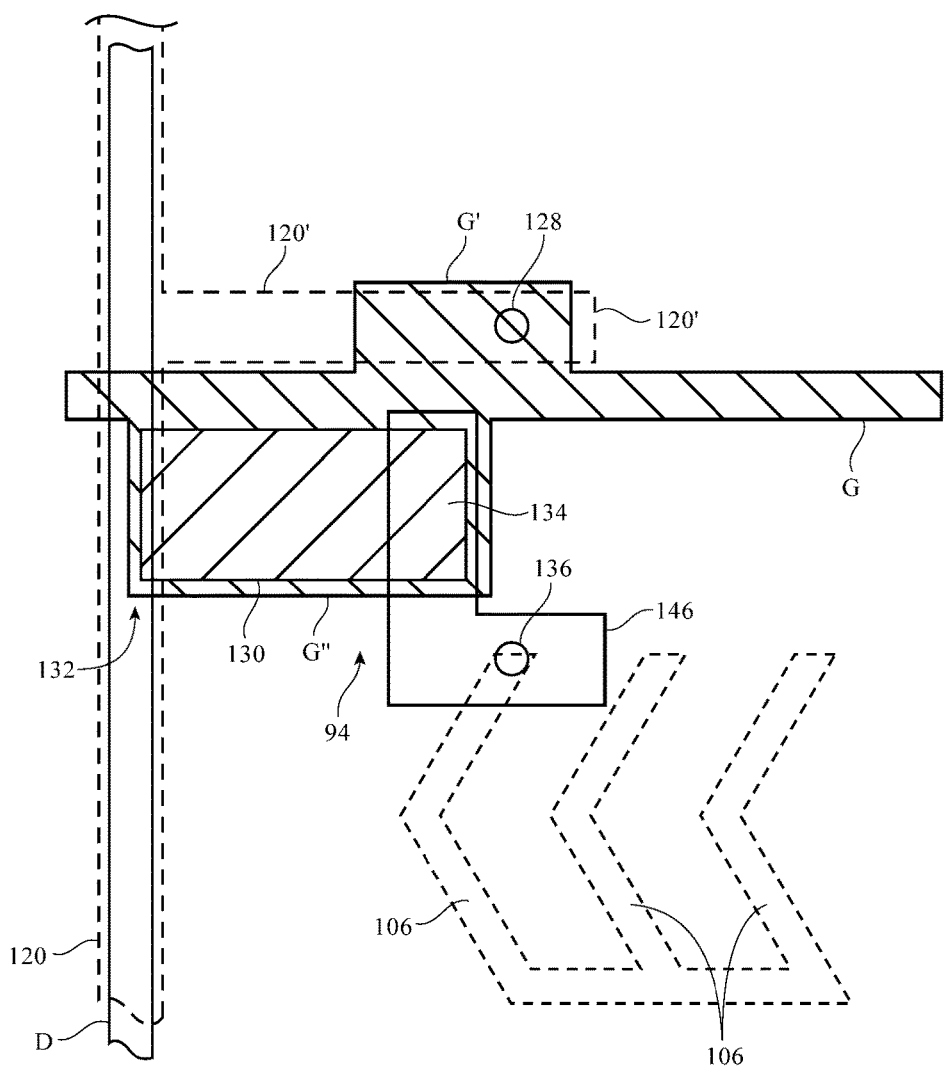
FIG. 8 is a layout diagram of an illustrative junction between the vertical gate line extensions and horizontal gate lines in the vicinity of a pixel in accordance with an embodiment.
Figure 8:
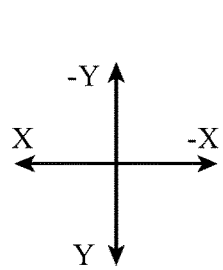

Any suitable interconnection structures may be used for forming connections 128 of FIG. 7. FIG. 8 is a top view of an illustrative set of interconnection structures associated with a given one of pixels 90 of FIG. 7 and its connection 128 on thin-film transistor layer 58. As shown in FIG. 8, data line D may run vertically across display 14. A pixel such as pixel 90 of FIG. 8 may be located at the intersection of data line D with each gate line G. Each pixel 90 may include a pixel electrode 106 (e.g., an electrode with fingers for producing electric fields in the liquid crystal associated with pixel 90). Each pixel 90 may also include transistor 94 for controlling the voltage on electrode 106. Active area 130 of transistor 94 may be formed from a semiconductor (e.g., silicon, a semiconducting oxide, etc.). Gate line protrusion G" overlaps active area 130 and serves as the gate for transistor 94. Portion 132 of data line D is coupled to active area 130 and forms a first source-drain terminal (e.g., a drain terminal) for transistor 94. Portion 134 of metal pad 146 overlaps an opposing end of active area 130 and forms a second source-drain terminal for transistor 94 (e.g., a source terminal). Metal 146 may be coupled to electrode 106 using via 136.

Vertically extending line 120 may run parallel to date line D. As shown in FIG. 8, line 120 may, if desired, overlap line 120 (e.g., line 120 may run under overlapping data line D). This type of arrangement helps minimize the amount of light that is blocked by the inclusion of line 120 to display 14. Each line 120 may have a protrusion such as protrusion 120' that overlaps a corresponding protrusion in gate line G such as protrusion G'. Connection 128 may be formed from a via that couples protrusion 120' to protrusion G', thereby connecting line 120 to line G. Electrode 106 may be coupled to transistor 94 using via 136 and metal 146.

Figure 9:
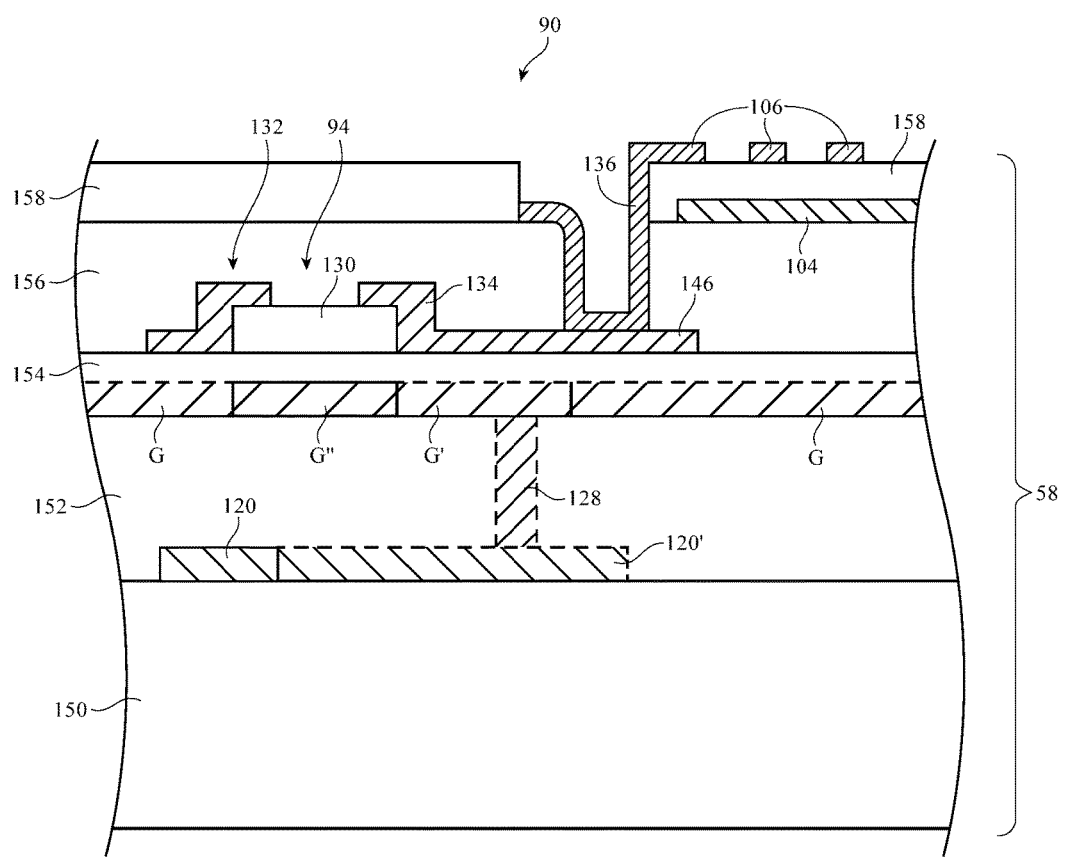
FIG. 9 is a cross-sectional side view of illustrative structures in a display in accordance with an embodiment.

A cross-sectional side view of the structures of pixel 90 of FIG. 8 viewed in the negative Y direction of FIG. 8 is shown in FIG. 9. As shown in FIG. 9, transistor 94 has a gate formed from gate line protrusion G" under active area 130. Gate insulator 154 separates active area 130 from gate G". Gate G" may be formed on a passivation layer such as dielectric 152 on substrate 150. Dielectric layers 156 and 158 may serve as passivation layers above transistor 94. Substrate 150 may be formed from glass, plastic, or other substrate material. Layers 152, 154, 156, and/or 158 may be formed from transparent inorganic materials (oxides, nitrides, etc.), may be formed from transparent organic materials (e.g., polymers such as photoimageable polymers), may be formed from transparent photoimageable or non-photoimageable spin-on-glass materials, and/or may be formed from other transparent dielectric materials. Materials such as spin-on glass materials may exhibit good thermal stability, low dielectric constant, and satisfactory planarization capabilities. Other dielectrics may be used, if desired. For example, gate insulator layer 154 may be formed from an inorganic layer that includes silicon oxide and/or silicon nitride or other inorganic dielectric materials.

Portion 132 of data line D forms a first source-drain terminal for transistor 94 and portion 134 of metal layer 146 forms a second source-drain terminal for transistor 94. Via 136 couple metal 146 to electrode fingers 106. Vcom layer 104 (e.g., a blanket indium tin oxide layer such as layer 104' of FIG. 6) lies under electrode 106 and is separated from electrode 106 by dielectric 158. Connection 128 is formed from a metal via that connects protrusion 120' of vertical line 120 with protrusion G' of gate line G.

Figure 10:
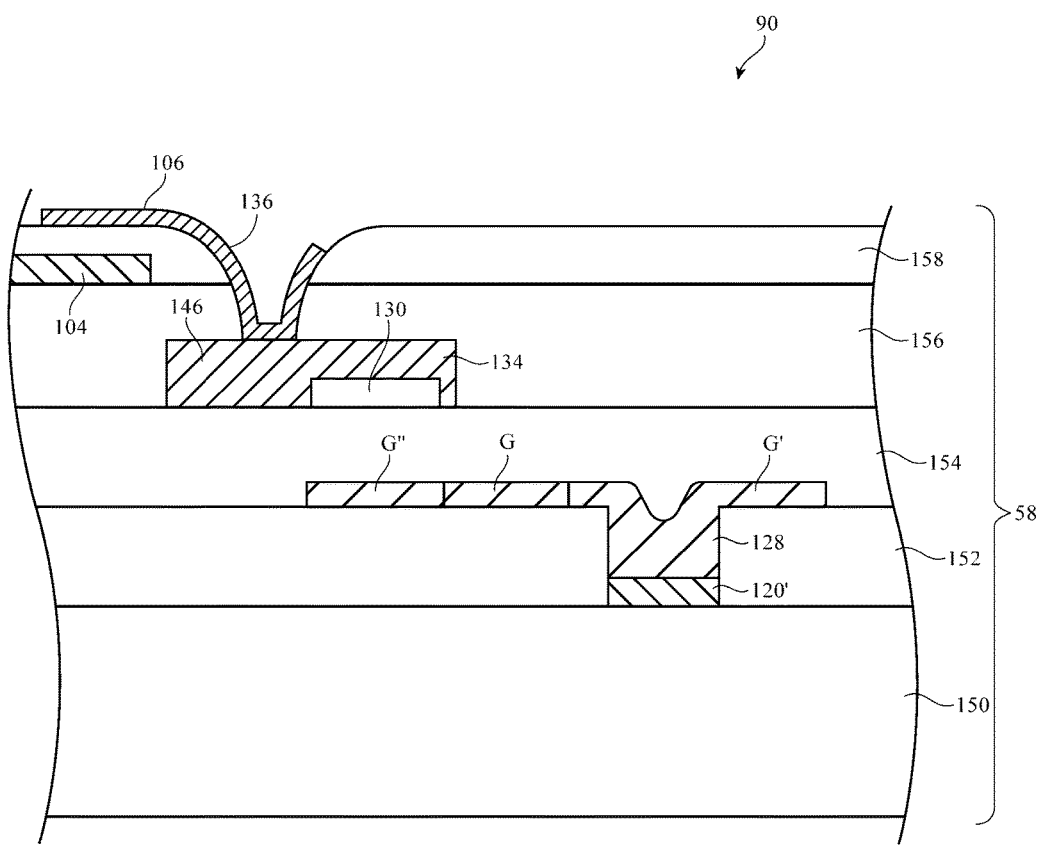
FIG. 10 is another cross-sectional side view of illustrative structures in a display in accordance with an embodiment.

FIG. 10 is a cross-sectional side view of the pixel structures of FIG. 8 viewed in direction X.

Figure 14:
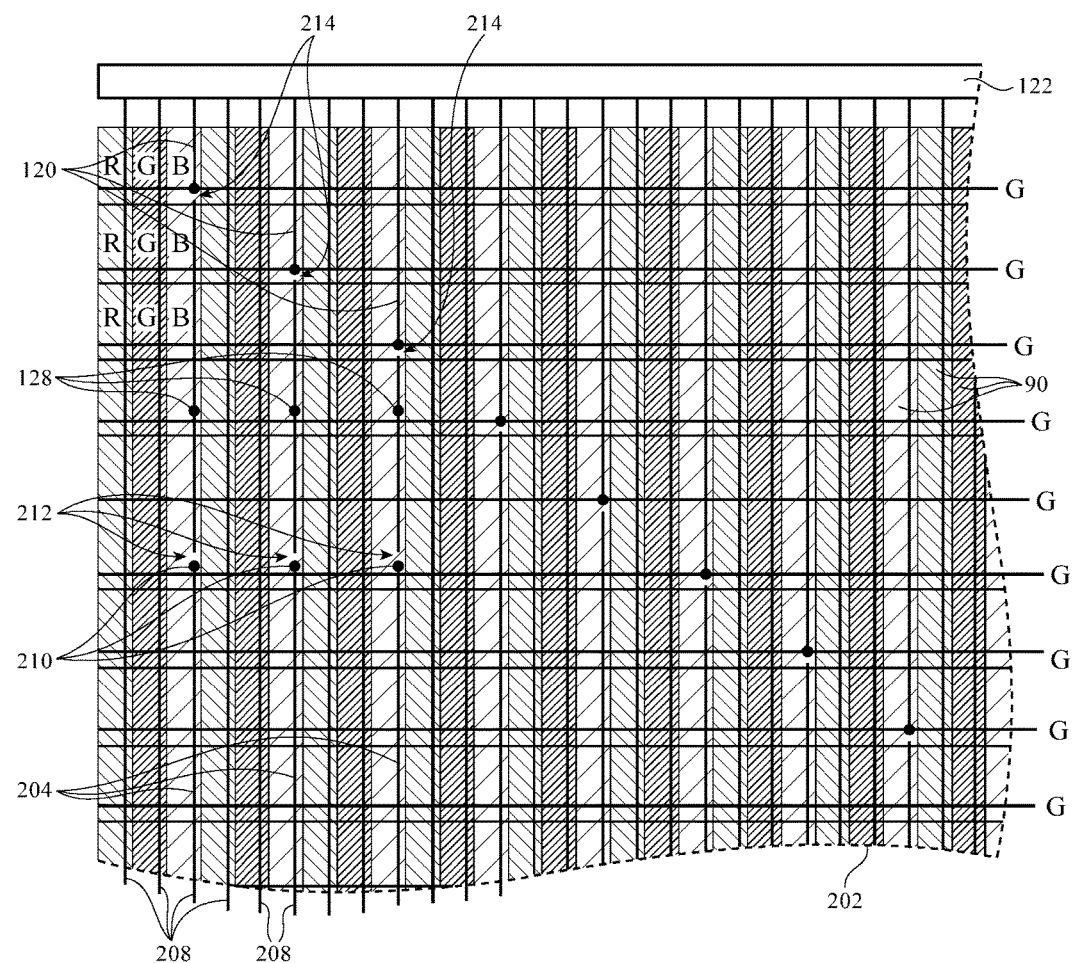

If desired, display 14 may be oriented in a rotated position relative to the orientation of FIG. 14 (e.g., lines G may extend vertically and lines 120 and lines D may extend horizontally). The orientation of FIG. 7 is merely illustrative.

Although sometimes described in the context of liquid crystal displays, the vertically extending gate line paths may be used in organic light-emitting diode displays and other displays (in which case the gate lines may sometimes be referred to as pixel control lines, scan lines, emission enable control lines, etc.). In such displays, there may be more than one horizontally extending control line in each row of pixels and therefore more than one corresponding vertically extending control line extension in each column of display pixels.

In arrays that have fewer columns than rows, multiple vertically extending lines may be provided in each column of pixels. For example, there may be two gate line extensions in a given column, one of which is connected to a gate line in a first row and another of which is connected to a gate line in a second row. In arrays that have fewer rows than columns, not every column need contain a gate line extension (i.e., some columns may have dummy gate line extensions that are not driven during use of display 14 or may omit the gate line extensions).

Figure 11:
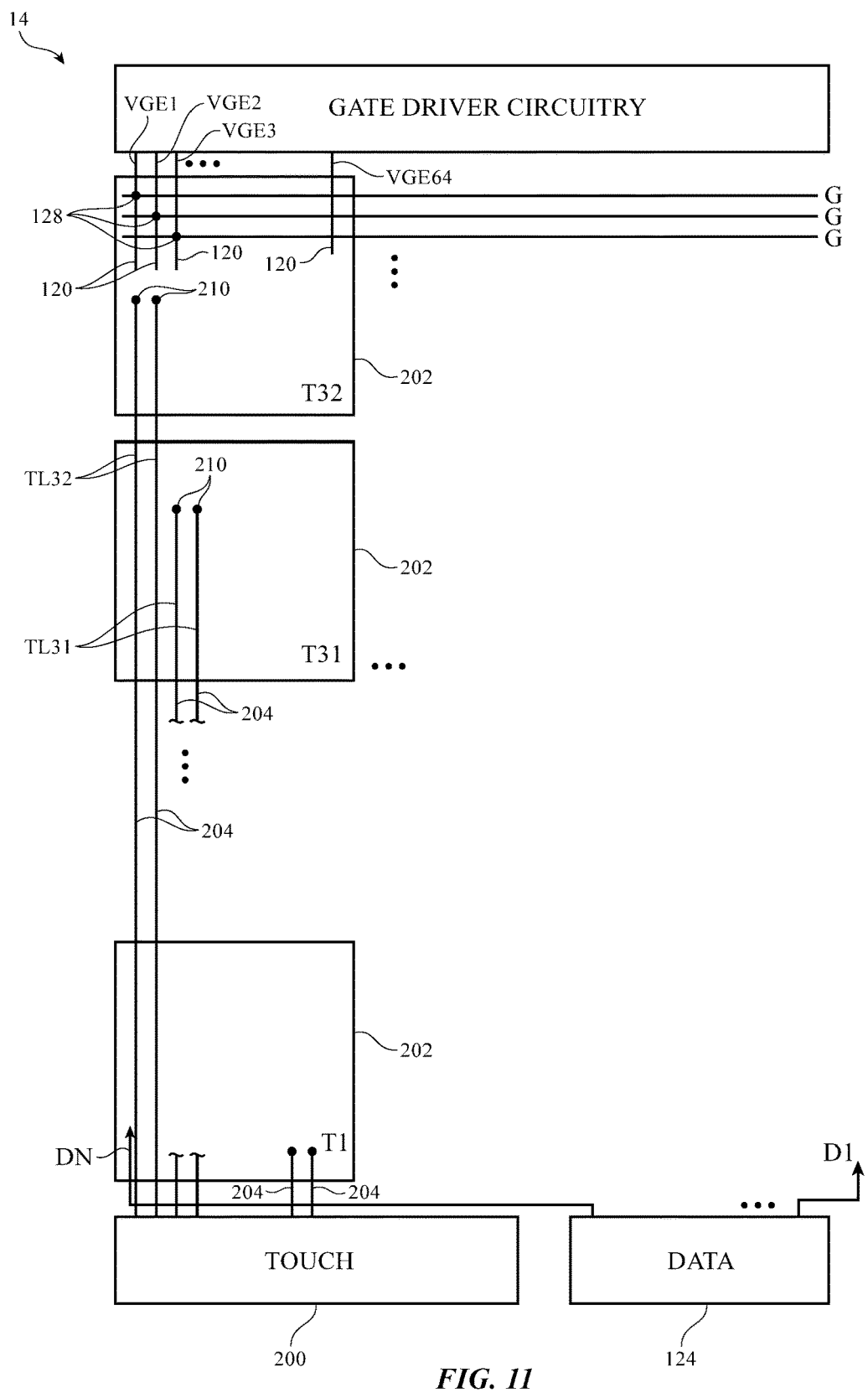
FIG. 11 is a top view of a display having a touch sensor and vertical gate line extensions in accordance with an embodiment.

If desired, display 14 may be provided with a touch sensor such as a capacitive touch sensor having an array of capacitive touch sensor electrodes. FIG. 11 is a top view of display 14 in an illustrative configuration in which display 14 has been provided with an array of capacitive touch sensor electrodes 202. Gate driver circuitry 122 may supply gate signals to gate lines G using vertical gate line extensions 120. Lines that are aligned with lines 120 (i.e., line that are extensions of lines 120 but that are not electrically connected to lines 120) such as touch sensor signal lines 204 may be coupled to respective electrodes 202. Electrodes 202 may be transparent and may each overlap multiple pixels 90.

Gate driver circuitry 122 may be formed from one or more integrated circuits and/or thin-film transistor circuitry along an upper edge of display 14. Touch sensor processing circuitry 200 and data line driver circuitry 124 may be formed from one or more integrated circuits and/or thin-film transistor circuitry located along an opposing lower edge of display 14 (as an example). Touch sensor signal lines 204 may extend upwards through display 14 from touch sensor processing circuitry 200 and may be coupled to electrodes 202 at connections 210.

Lines 204 may be grouped in sets of two or more or three or more individual lines (e.g., sets of parallel lines that are shorted together to help reduce signal line resistance). The signal lines 204 in each set of lines 204 may be used to route touch sensor signals in parallel. As shown in FIG. 11, for example, two of lines 204 (i.e., lines TL32) may be used to couple touch sensor processing circuitry 200 to the $32^{nd}$ electrode 202 in a first column of an array of electrodes 202 on display 14, another two of lines 204 (i.e., lines TL31) may be used to couple touch sensor processing circuitry 200 to the $31^{st}$ electrode 202 in the first column of electrodes 202, etc.

FIGS. 12, 13, 14, 15, 16, and 17 show illustrative touch sensor signal line and vertical gate line extension layouts that may be used for display 14.

Figure 12:
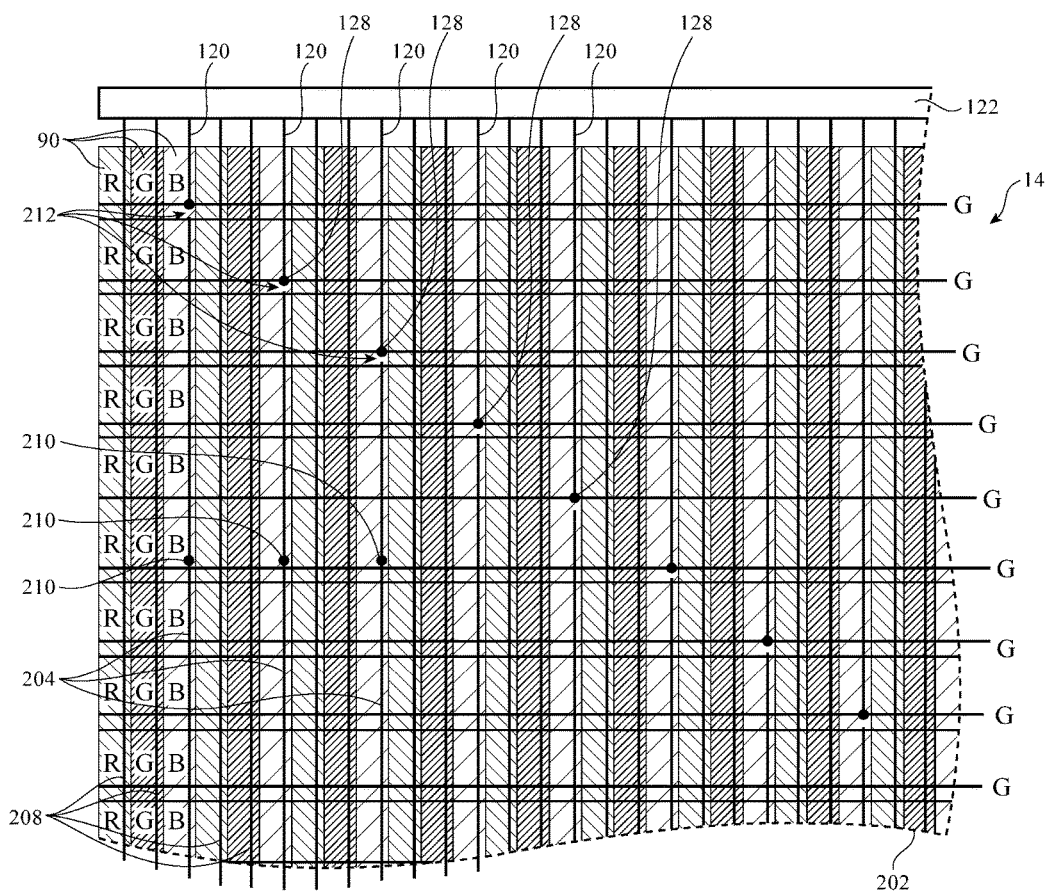
FIGS. 12, 13, 14, 15, 16, and 17 are layout diagrams for illustrative signal lines in a display of the type shown in FIG. 11 in accordance with embodiments.

In the example of FIG. 12, touch sensor signal lines 204 are associated with columns of blue subpixels B. Each of lines 204 may, for example, overlap a corresponding data line for a column of blue subpixels (pixels) B. Lines 204 may be aligned with respective gate lines extensions 120 and may each be separated and therefore electrically isolated from a respective one of gate lines extensions 120 by a gap 212. Optional supplemental lines 208 may be used for in-panel routing of power and control signals (e.g., a low power supply voltage VGL, clock signals, a gate output enable signal GOE, etc.). Supplemental signal lines 208 may be coupled to gate driver circuitry 122 and may, if desired, overlap data lines in columns of red subpixels R and green subpixels G (as an example).

Figure 13:
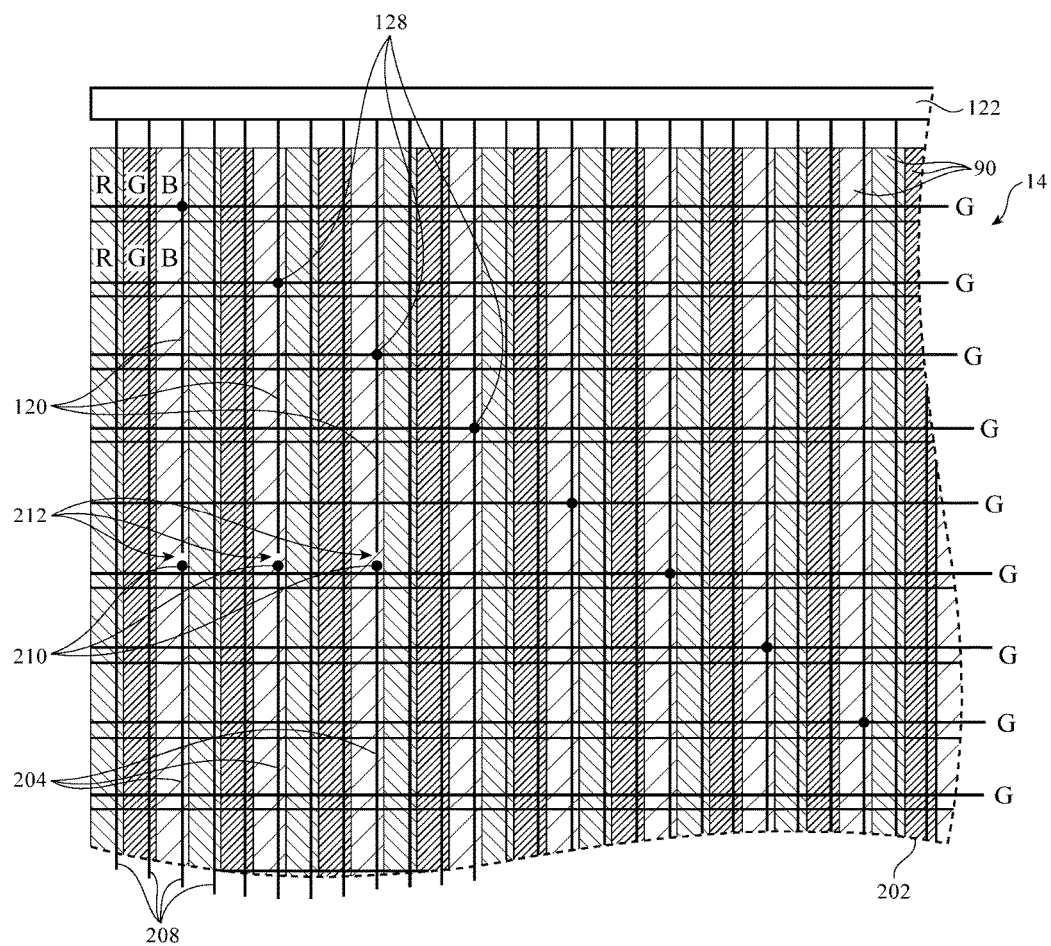

In the arrangement of FIG. 12, each touch sensor signal line 204 may extend upwards past its connection 210 to one of electrodes 202. If desired, lines 204 may terminate at connections 210 and gate line extensions 120 may extend downwards past their connections 128 with gate lines G, as shown in FIG. 13. This may help to reduce touch-electrode-to-touch-electrode crosstalk that might otherwise arise in situations in which touch signal lines 204 from one row of electrodes overlap electrodes in another row.

The example of FIG. 14 shows how the portions of gate line extensions 120 that extend downwards past connections 128 may be electrically separated from the rest of the gate line extensions by gate line extension gaps 214. This type of arrangement may help reduce capacitive loading on vertical gate line extensions 120.

Figure 16:
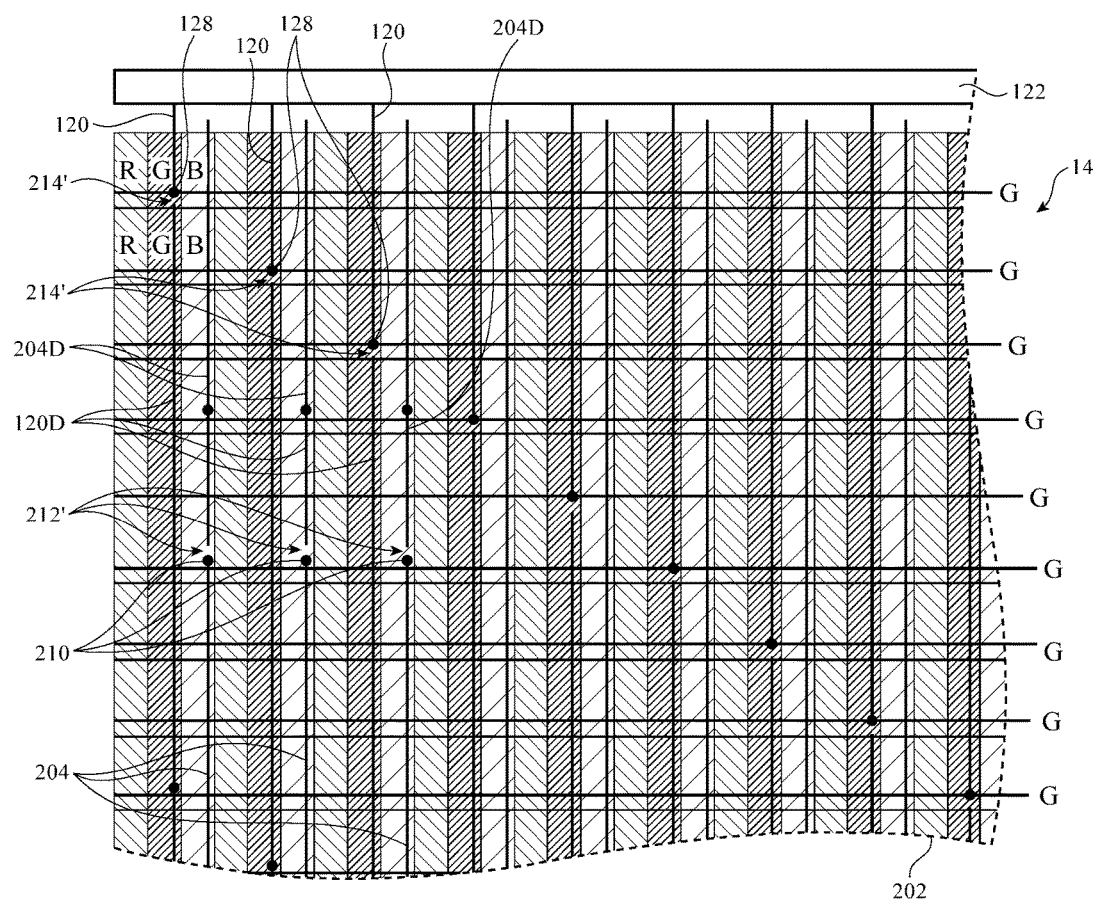
Figure 17:
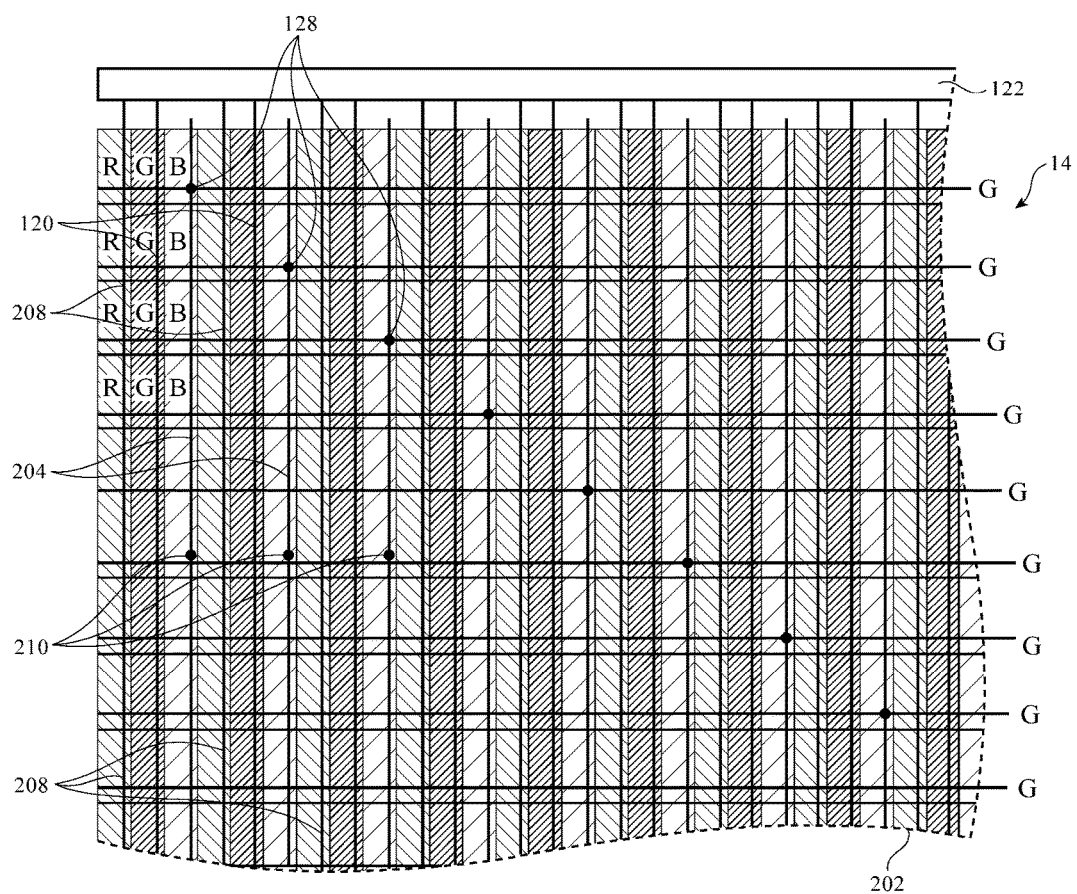

If desired, an interleaved vertical signal line arrangement may be used in which some of the vertical lines in display 14 (e.g., some of the vertical lines that overlap underlying data lines) serve as vertical gate line extensions, serve as touch sensor signal lines, and optionally serve as supplemental lines. Configurations such as these are shown in FIGS. 15, 16, and 17.

Figure 15:
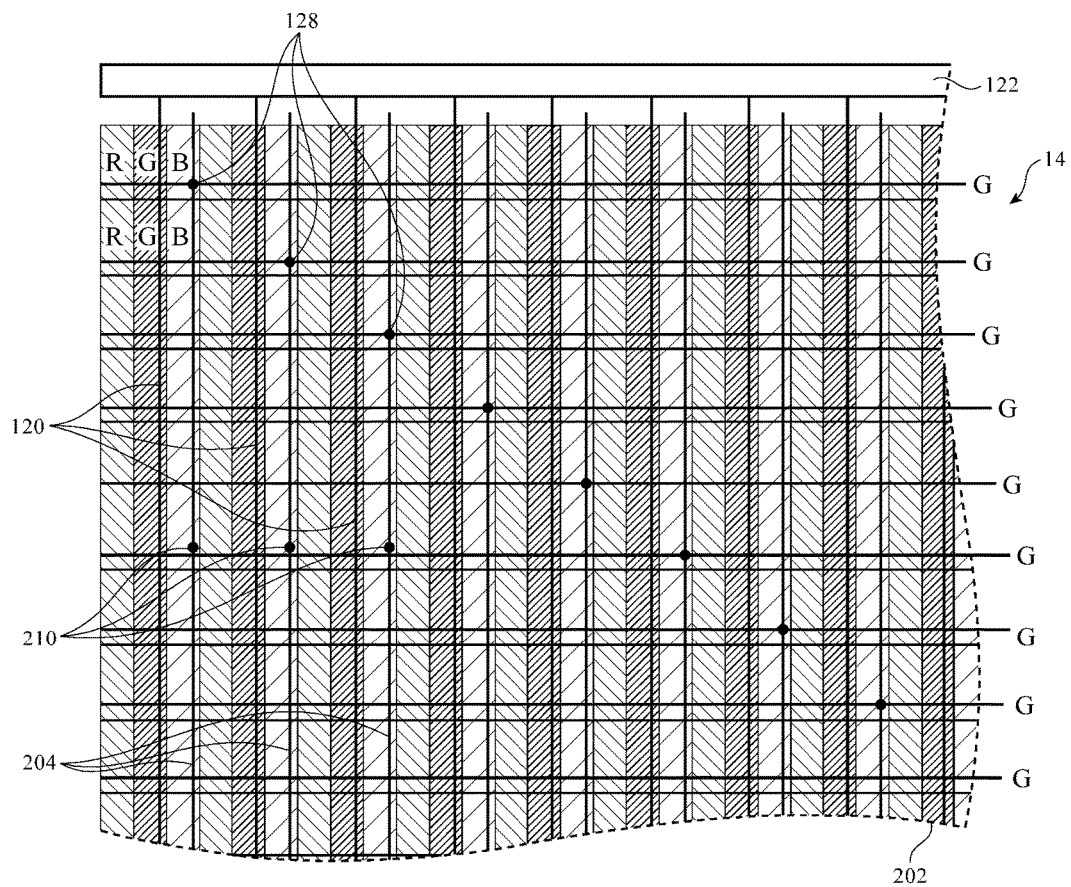

In the example of FIG. 15, some of the vertical lines in display 14 are used to form vertical gate line extensions 120 and some of the vertical lines (i.e., vertical lines in different columns of pixels 90) are used to form touch sensor signal lines 204. In the example of FIG. 16, gaps 212' separate electrically floating dummy touch sensor signal line segments 204D from touch sensor signal lines 204 to reduce crosstalk. Gaps 214' separate vertical gate line extensions 120 from respective dummy vertical gate line extensions 120D. FIG. 17 shows how supplemental lines 208 may be formed in columns of pixels 90 that are different from the columns of pixels 90 containing the vertical gate line extensions 120 and that are different from the columns of pixels containing touch sensor signal lines 204. Supplemental lines such as supplemental lines 208 of FIG. 17 may be used in the arrangements for display 14 in FIGS. 15 and 16, if desired.

The foregoing is merely illustrative and various modifications can be made by those skilled in the art without departing from the scope and spirit of the described embodiments. The foregoing embodiments may be implemented individually or in any combination.

What is claimed is:
1. A display, comprising:
an array of pixels organized in rows and columns;
a plurality of horizontally extending gate lines each of which is associated with a respective one of the rows of pixels;
a plurality of vertically extending data lines each of which is associated with a respective one of the columns of pixels;
a plurality of vertically extending gate line extensions each of which is associated with a respective one of the columns of pixels and each of which is connected to a respective one of the horizontally extending gate lines so that gate line signals are provided from the vertically extending gate line extensions to the horizontally extending gate lines, wherein each vertically extending gate line extension runs under a respective one of the vertically extending data lines; and
vertical touch sensor signal lines.
2. The display defined in claim 1 wherein the vertical touch sensor signal lines are each aligned with a respective one of the vertically extending gate line extensions.
3. The display defined in claim 2 further comprising capacitive touch sensor electrodes.

4. The display defined in claim 3 wherein each of the capacitive touch sensor electrodes is connected to at least one of the vertical touch sensor signal lines.
5. The display defined in claim 4 wherein the vertical touch sensor signal lines include sets of at least two vertical touch sensor signal lines and wherein each of the capacitive touch sensor electrodes is connected to each of the vertical touch sensor signal lines in a respective one of the sets.
6. The display defined in claim 1 further comprising supplemental signal lines that run parallel to the vertical touch sensor signal lines and the vertically extending gate line extensions.
7. The display defined in claim 1 further comprising additional vertically extending lines, wherein each additional vertically extending line is aligned with a respective one of the vertically extending gate line extensions and is separated from that vertically extending gate line extension by a first gap and each additional vertically extending line is aligned with a respective one of the touch sensor signal lines and is separated from that touch sensor signal line by a second gap.
8. The display defined in claim 1 further comprising touch sensor processing circuitry coupled to the touch sensor signal lines.
9. The display defined in claim 8 further comprising:
a substrate on which the pixels are formed; and
gate driver circuitry coupled to the vertically extending gate line extensions, wherein the touch sensor processing circuitry and the gate driver circuitry are located at opposing edges of the substrate.
10. The display defined in claim 9 further comprising data line driver circuitry coupled to the vertically extending data lines.
11. The display defined in claim 10 wherein at least a portion of each vertically extending gate line extension overlaps a respective one of the vertically extending data lines.
12. The display defined in claim 1 wherein each vertically extending gate line extension is coupled to a respective first connection that couples the vertically extending gate line extension to a respective horizontally extending gate line of the plurality of horizontally extending gate lines, wherein each vertical touch sensor signal line is coupled to a respective second connection that couples the vertical touch sensor signal line to a capacitive touch sensor electrode, wherein each vertical touch sensor signal line terminates at the respective second connection, and wherein each vertically extending gate line extension extends past the respective first connection.
13. A display, comprising:
rows and columns of pixels, each pixel having at least one transistor with a gate;
a plurality of gate lines each of which is connected to the gates of the transistors in the pixels of a respective one of the rows;
a plurality of data lines running perpendicular to the gate lines;
a plurality of gate line extensions each of which runs parallel to the data lines and each of which is connected to a respective one of the gate lines; and
a plurality of touch sensor signal lines that extend parallel to the gate line extensions, wherein each touch sensor signal line of the plurality of touch sensor signal lines is separated from a respective gate line extension of the plurality of gate line extensions by a gap.

14. The display defined in claim 13 wherein each of the touch sensor signal lines is aligned with a respective one of the gate line extensions.

15. The display defined in claim 13 wherein each gate line extension is coupled to a respective first connection that couples the gate line extension to a respective gate line of the plurality of gate lines.

16. The display defined in claim 15 wherein each touch sensor signal line is coupled to a respective second connection that couples the touch sensor signal line to a capacitive touch sensor electrode.

17. The display defined in claim 16 wherein each touch sensor signal line terminates at the respective second connection.

18. The display defined in claim 17 wherein each gate line extension extends past the respective first connection.

19. The display defined in claim 13 wherein each gap is adjacent a connection between the touch sensor signal line and a respective capacitive touch sensor electrode.

20. A display, comprising:
rows and columns of pixels, each pixel having at least one transistor with a gate;
a plurality of gate lines each of which is connected to the gates of the transistors in the pixels of a respective one of the rows;
a plurality of data lines running perpendicular to the gate lines;
a plurality of gate line extensions each of which runs parallel to the data lines and each of which is connected to a respective one of the gate lines by a respective first connection, wherein each gate line extension extends past the respective first connection;
a plurality of touch sensor signal lines that extend parallel to the gate line extensions;
a plurality of capacitive touch sensor electrodes each of which is coupled to at least one of the plurality of touch sensor signal lines by a respective second connection, wherein each touch sensor signal line terminates at the respective second connection; and
touch sensor processing circuitry coupled to the touch sensor signal lines.

\* \* \* \* \*